United States Patent [19]

Ford

[11] Patent Number: 4,740,655

[45] Date of Patent: Apr. 26, 1988

[54] ELECTRICAL RECEPTACLE SAFETY COVERING

[76] Inventor: Don S. Ford, 3926 S. Kings Ave., Lot 14, Brandon, Fla. 33511

[21] Appl. No.: 874,582

[22] Filed: Jun. 16, 1986

[51] Int. Cl.⁴ ............................................ H05K 5/03

[52] U.S. Cl. ..................................... 174/67; 220/242; 220/324

[58] Field of Search .................. 174/67; 220/242, 324; 339/36, 37, 44 R, 44 M; 16/266; 439/142

[56] References Cited

U.S. PATENT DOCUMENTS

| | | | |
|---|---|---|---|
| 2,916,733 | 12/1959 | Hirsch | 174/67 X |
| 2,963,734 | 12/1960 | Hugat | 16/266 |
| 4,048,051 | 9/1977 | Gretz | 220/324 X |
| 4,508,933 | 4/1985 | Carvel | 174/67 |

*Primary Examiner*—Arthur T. Grimley
*Assistant Examiner*—David A. Tone
*Attorney, Agent, or Firm*—Charles A. McClure

[57] ABSTRACT

Electrical receptacle safety covering means and method, to protect persons too young to appreciate the hazards of electricity from access to the outlets of electrical receptacles by requiring skills of an older child or adult to uncover such a receptacle. Spring-biased security is provided in which an action separate from closing a cover over an electrical receptacle is required to latch the cover, and unlatching it can not be accomplished by pulling on the cover in its opening direction but necessitates overcoming a latching spring-bias in a separate preliminary unlatching step. A combination of a receptacle plate (more or less flush with the receptacle) and a cover for the front thereof has at least one spring and a cooperating slide adapted to move relative thereto between a latched position free of spring bias and an unlatched position subject to spring bias. Preferably the cover carries a pair of such slides and springs, and the plate has grooved flanges engaged by the slides only in the latched position.

30 Claims, 1 Drawing Sheet

ELECTRICAL RECEPTACLE SAFETY COVERING

FIELD OF THE INVENTION

This invention relates to safety covering of the outlets of electrical receptacles, and concerns especially secure latching of outlet covers, to protect infants, etc. from electrical shock.

BACKGROUND OF THE INVENTION

Protection of children and pets from ill effects of curiosity about electrical receptacles is well recognized as an objective, and various types of covering for such outlets have been devised. Examples of more or less childproof covers, pivotally attached to special receptacle base plates or housings, having various spring latches appear in Davis U.S. Pat. No. 4,451,101; Carvel U.S. Pat. No. 4,508,933; and Stanback U.S. Pat. No. 3,334,770. Such covers, upon being forcibly closed, flex some latching spring member and become latched automatically. Reopening the cover is intended to be accomplished by flexing such self-latching spring member again to unlatch it, thus enabling the cover to be pivoted open with application of minimal force.

Unfortunately, such devices may be reopened by forcing the cover itself in the opening direction, although intended to be unlatched first as just noted. Weakening of a spring latching member by continued usage, or intentional distortion of such a member by a user so as to release the latch more easily, can be expected to defeat the safety feature—and possibly subject the manufacturer to product liability if electric shock ensues.

Another disadvantage of such devices is that they render the electrical receptacle unusable with the cover closed, and when in use with the cover open are as hazardous as an unprotected outlet.

SUMMARY OF THE INVENTION

A primary object of the present invention is to protect persons too young to appreciate the hazards of electricity from access to the outlets of electrical receptacles, by covering the outlets so as to require skills of an older child or adult to uncover them.

Another object of this invention is to provide a spring-biased protective cover arrangement in which action separate from closing the cover is required to latch it and, hence, unlatching it can not be accomplished by pulling on the cover in its opening direction.

A further object of the invention is to enable an electrical receptacle to be used while closed from view by a protective cover.

In general, the objects of this invention are accomplished by separating the protective function of safety covering of electrical receptacles into discrete cooperating latching and spring-biasing safety or security functions.

More particularly, the invention is conveniently embodied, for an electrical receptacle, in a combination of plate means (more or less flush with the receptacle) and of covering means for the front thereof, wherein one such means carries along an edge thereof both a spring member and a slide member adapted to move relative thereto between a latched position free of spring bias and an unlatched position subject to spring bias. In a preferred embodiment, the covering means carries a pair of such slide and spring members.

Other objects of the present invention, together with means and methods for accomplishing the various objects, will be apparent from the following description and the accompanying diagrams of one or more embodiments of the invention, being presented by way of example rather than limitation.

DETAILED DESCRIPTION OF THE INVENTION

Figure 1:
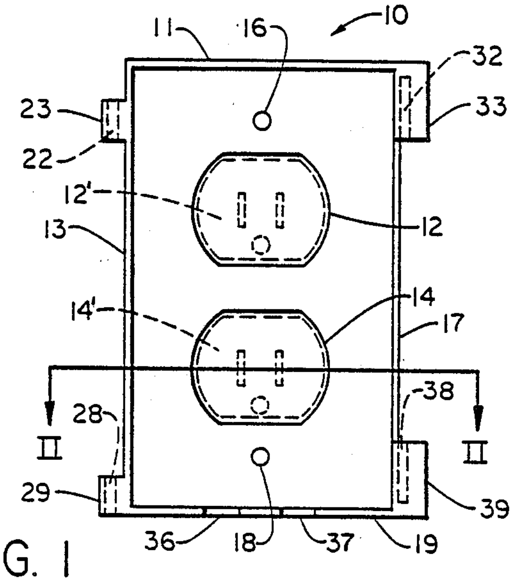
FIG. 1 is a front elevation of an electrical receptacle plate modified according to this invention.

FIG. 1 shows, in front elevation, receptacle plate 10 of the present invention having upper and lower openings 12 and 14 to fit in conventional manner over two correspondingly shaped electrical receptacle outlet members 12' and 14' (in dashed lines) and thus to admit electrical plugs (not shown). The plate also has upper and lower smaller openings 16 and 18 to receive screws (not shown) for securing the plate as usual to such an electrical receptacle. Top edge 11, left edge 13, and bottom edge 19, project from the back (hidden here) of the receptacle plate forward beyond the receptacle which lies in the plane of the view, whereas right edge 17 is flush with the face of the receptacle, as shown in detail later. Extending from left edge 13, pair of hinge socket butts 23 and 29, are spaced respectively below the plate top edge and flush with its bottom edge, with vertical bore 22 in socket butt 23, and a like bore 28 in socket butt 29, as indicated in dashed lines. Extending along its right side, plate 10 has pair of short top and bottom flanges 33 and 39, flush with the plate's corresponding horizontal edges. Each such flange is grooved vertically along its rear surface beginning a short way from such horizontal edge and extending to the opposite horizontal edge of the flange, as indicated in dashed lines for groove 32 in flange 33 and groove 38 in flange 39. Pair of slots 36 and 37 (shown in dashed lines) in bottom edge 19 of the receptacle plate are available as passages for electrical cords (not shown) to the outside when covered, as shown subsequently.

Figure 2:
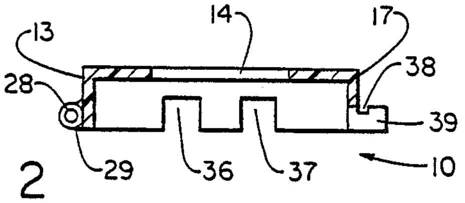
FIG. 2 is a sectional plan through the same plate, taken at II—II in FIG. 1.

FIG. 2 shows receptacle plate 10 in sectional plan, midway through lower receptacle opening 14, as indicated at II—II. This view illustrates more clearly the recessing of right edge 17 and the forward extent of left edge 13 and bottom edge 19, with pair of cord slots 36 and 37 therein. Also visible, here are lower hinge butt 29 with bore 28 therein, and lower flange 39 with groove 38 in the rear face thereof.

Figure 3:
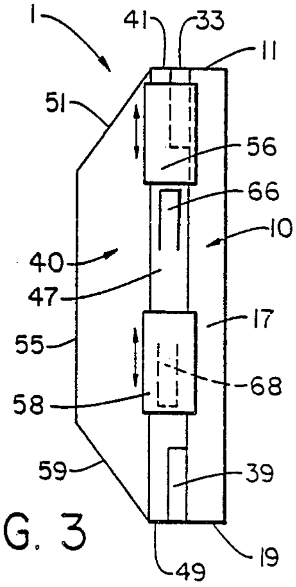
FIG. 3 is a right side elevation of the apparatus of FIGS. 1 and 2 covered according to the invention.

FIG. 3 shows, in right side elevation, receptacle plate 10 and receptacle cover 40 as an assembled embodiment of this invention, in closed position. The cover has top, bottom, and right edges 41, 49, and 47 (left edge 43 is hidden in this view) and is generelly frustopyramidal in shape, as shown more clearly in later views. The cover has central face 55 parallel to the plate and has oblique top and bottom faces 51 and 59 also perpendicular to the plane of this view (and, thus, shown here only as lines), oblique right face 57 visible here, and oblique left face 53 (hidden). Right side edge 47 of the cover carries upper spring tab 66 projecting outward from the side surface with its lower end integral therewith and its upper end free and projecting outward just below slide 56. Lower spring tab 68 is a mirror image of the upper tab but has lower slide 58 overlying it and, thus, is indicated in dashed lines.

Thus, in FIG. 3, the upper slide is shown in the latched position, and the lower slide is shown in the unlatched position. It will be apparent that the protruding tab end would have to be depressed to enable the upper slide to be moved down from its present position (partly overlying grooved flange 33 of receptacle plate 10) wholly onto cover 40 before the cover could be pivoted to the uncovering or open position away from the face of the plate.

Figure 5:
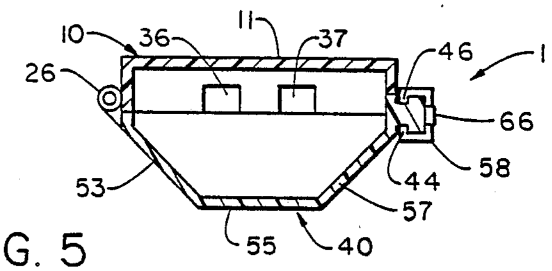
FIG. 5 is a sectional plan of the same apparatus taken at V—V in FIG. 4.
Figure 4:
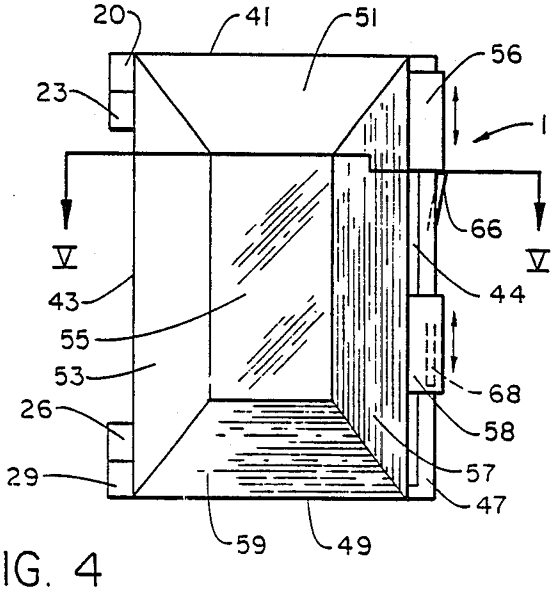
FIG. 4 is a front elevation of the apparatus of FIG. 3.

FIGS. 4 and 5, show embodiment 1 of this invention, in side elevation and sectional plan, respectively.

Visible in FIG. 4 are upper, left, right, and lower oblique faces 51, 53, 57, and 59 (as well as vertical central face 55) of cover 40, terminating at respective upper, left, right, and lower edges 41, 43, 47, and 49 of the cover. Vertical central face 55 of the cover is bounded by the oblique faces. Protruding at the left edge of the cover are upper and lower hinge pin butts 20 and 26 resting upon receptacle plate socket butts 23 and 29, respectively. Also prominent is the free end of upper spring tab 66 projecting to the right beyond the right side surface of the cover just below the bottom end of upper slide 56. Lower slide 58 overlies lower spring tab 68, which is indicated in dashed lines. As shown in succeeding diagrams, the slides are generally U-shaped in plan and ridged at their inner edges (like type serifs at the top of the U) to ride in vertical front groove 44 and in rear groove 46 (hidden) along the right edge of the cover and aligned grooves 32 and 38 in the rear surfaces of flanges 33 and 39 of plate 10 (FIG. 1).

FIG. 5 shows the same assembled embodiment in sectional plan as taken at V—V in FIG. 4, looking downward from a level between the bottom end of latched upper slide 56 (not seen) and the free end of latching spring tab 66, on the one hand, and on the other hand at the level of the the junction between oblique surface 51 and vertical surface 55 of cover 40. Visible, except to the extent it is obscured by the protruding end of upper spring tab 66 is the upper end of lower slide 58, whose ridged edges are retained wholly within front and rear grooves 44 and 46 of the cover.

Figure 6:
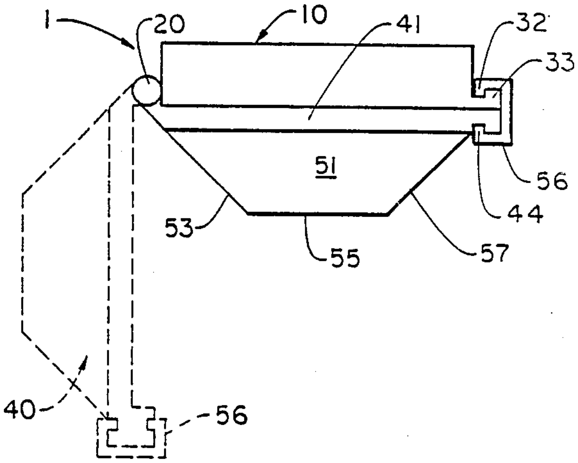
FIG. 6 is a plan view of the same apparatus still closed or covered but with an alternative open view shown in dashed lines.

FIG. 6 shows the same assembled embodiment in plan, still in the closed or covered position but also indicating an alternative open position of cover 40 in dashed lines. Visible at the left is the top of hinge pin butt 20 integral with cover 40 and flush with top edge 41 thereof.

Also visible end-on, at the right in FIG. 6, is upper slide 56, the upper portion of whose ridged edge at the rear is engaged in groove 32 in plate flange 33, and all of whose ridged edge at the front is engaged in groove 44 along the right side edge of the front of the cover; its lower ridged portions are riding in the latter groove at the front and in matching groove 46 along the same side edge of the rear face of the cover. The open cover position, indicated here in dashed lines, is attainable only if both slides are positioned over their respective adjacent spring tabs, of course, and wholly disengaged from the aligned plate flanges.

Operation of the illustrated and described embodiment of this invention is readily understood. When the cover is in its closed position, with either (or both) of the slides latched between a (the) protruding tab end(s) and adjacent corner(s) of the assembly, the cover cannot be opened unless and until each protruding tab end is depressed (manually) and both of the slides are slid thereover far enough to disengage each slide from the corresponding grooved flange on the receptacle plate. To do so requires such a degree of hand-eye coordination and strength as to preclude young infants (as well as animals) from doing so, whereas adults and older children should have little or no difficulty.

Similarly, for the open cover to be reclosed, both slides must clear the plate flanges. If they are still overlying their spring tabs, little or no adjustment should be necessary. If not, the tab end(s) should be depressed by hand and the slides then be slid thereover until clear of the flanges. After the cover is closed, it can be latched shut by sliding at least one at least one slide onto the adjacent flange (preferably both) over and past the adjacent spring tab until the free end protrudes, thereby trapping the adjacent slide partly overlying a flange of the plate, and thereby securing the cover in its closed position.

Although in the described and illustrated embodiment the cover carries the latching spring tabs and slides permanently, and the slides engage the plate flanges only when the cover is closed, the situation could be reversed so that the flanges could be on the cover and the latching spring tabs and slides be carried by the plate, suitably grooved to do so as the cover has been shown to be.

It will be apparent that the latch of this invention cannot be defeated by pulling on the cover in the opening direction because the functions of closing and latching are separate, rather than combined into the flexing of some spring member, as is common.

Moreover, movement of the slide(s) between the latched and unlatched positions is perpendicular to the opening direction, and deflection of the spring tabs to enable such movement of the slides is perpendicular to both the other two movements. More in the way of understanding and manipulation is required than small children can be expected to have until they reach such an age of discretion that they can refrain from opening the cover because they know enough not to do so.

The cover can be removed completely from the receptacle plate if desired, as when its protective function is no longer required, simply by lifting the open cover to disengage the hinge pins on the cover from the sockets on the plate.

The electrical receptacle safety covering of this invention does not require any unusual material or method of manufacture. It preferably is made of electrically non-conductive thermosetting or thermoplastic composition, as by injection molding or other suitable process. Acceptable compositions include polyvinyl chloride, nylon, polypropylene, bakelite, and hard rubber, for example. Wood, glass, and ceramic materials also may be used satisfactorily.

Some variants of the preferred embodiment have been suggested above. Other modifications may be made, as by adding, combining, deleting or subdividing parts or steps, while retaining at least some of the advantages and benefits of the present invention, which itself is defined in the following claims.

The claimed Invention:

1. In safety covering of outlets of an electrical receptacle, including rigid plate means to fit substantially flush therewith and rigid covering means adapted to fit in a closed position closely over the plate means and adapted to move to an open position to expose the outlets, the improvement wherein one of said means carries a spring member and a slide member, having an unlatched condition wherein the slide member engages the spring member and is free of engagement with the other means and having a latched position wherein the slide member is free of the spring member but engages the other of said means, and the other of said means comprises a flange member adapted to be engaged by the slide member only in the closed position.

2. Electrical receptacle safety covering according to claim 1, wherein the cover means carries the latching slide member and the slide-engaging member, and the plate means comprises a flange member adapted to be engaged by the slide member only in the closed position.

3. Electrical receptacle safety covering according to claim 1, including another such latching slide member and slide-engaging spring member on one of said means, and including on the other of said means another such flange engageable by the added slide member.

4. Electrical receptacle safety covering according to claim 1, wherein one of said means includes a passageway available for an electrical cord between the interior and the exterior in the closed position as well as in the open position.

5. Electrical receptacle safety covering according to claim 4, wherein the plate means includes the passageway.

6. Electrical receptacle safety covering according to claim 1, wherein the cover means is supported pivotally by pins on the cover means and cooperating sockets on the plate means, and is removable therefrom by lifting disengagement of the pins from the sockets.

7. In safety covering of outlets of an electrical receptacle, including plate means and covering means adapted to fit in a closed position closely over the plate means and adapted to move to an open position to expose the outlets, the improvement wherein one of said means carries a pair of latch-securing spring members and a pair of spring-free latching slide members adapted to move between an unlatched condition engaging the respective spring members and free of engagement with the other means and a latched condition free of engagement with the spring members but engaging the other means, and the other of said means comprises a pair of flange members adapted to be engaged by the respective slide members only in the closed position.

8. Electrical receptacle safety covering according to claim 7, wherein the latching slide members and the securing spring members are carried by a side edge of the cover means, and the flange members are carried by a side edge of the plate means, the respective side edges being mutually juxtaposable and being contiguous in the closed position of the cover means.

9. Electrical receptacle safety covering according to claim 8, wherein each of the spring members has one end flush with the side edge of the cover means and the other end protruding thereabove except when depressed by a slide member or manually by a user.

10. Electrical receptacle safety covering according to claim 7, wherein the cover means is supported by pivot pins on a vertical edge, normally resting in cooperating sockets on an adjacent vertical edge of the plate means and disengageable therefrom.

11. Electrical receptacle safety covering according to claim 7, wherein the flange members are on a vertical side edge of the plate means and extend for a short distance from substantially the top and bottom edges thereof, each having a groove therein to receive an edge of a slide member over about half the length of the slide member, and a vertical surface of the cover means has a groove therein alignable with the grooves in the flanges in the closed position to receive a side edge of each slide therein over the full length of the slide except when part of the length of the slide is along part of the length of one of the flanges.

12. Electrical receptacle safety covering according to claim 11, wherein a vertical surface of the cover means on an opposite face thereof from the aforementioned groove therein has a like groove adapted to receive a side edge of each slide similarly.

13. In safety covering of outlets of an electrical receptacle, including plate means and covering means adapted to fit in a closed position closely over the plate means and adapted to move to an open position to expose the outlets, the improvement wherein the cover means carries a pair of latch-securing spring members and a pair of latching slide members adapted to move between an unlatched condition engaging the respective spring members and free of engagement with the other means and a latched condition free of engagement with the spring members but engaging the plate means, and the plate means comprises a pair of flange members adapted to be engaged by the respective slide members only in the closed position; and the cover means also includes hinge pins along one vertical edge thereof, the plate means also includes hinge sockets along an adjacent vertical edge thereof and adapted to receive the cover hinge pins, the cover means being pivotable relative to the plate means to uncover and recover the outlets of such a receptacle and being also disengageable from the plate means upon being lifted to disengage the pins from the sockets.

14. Electrical receptacle safety covering according to claim 11, wherein the latching slide members, are U-shaped and the portions of the cover means and the plate means engageable by the slide members are grooved to receive cooperating ridged portions of the slide members.

15. Electrical receptacle safety covering according to claim 11, including an opening between the interior and the exterior in the closed position to accommodate an electrical cord therein.

16. Electrical receptacle safety covering according to claim 14, wherein the plate means has a pair of such openings therethrough to accommodate a pair of electrical cords therein.

17. In procedure for safety covering of outlets of an electrical receptacle, wherein such outlets are coverable by cover means that is latchable to receptacle plate means by latching means to inhibit opening the cover means to uncover the outlets, and that is unlatchable and then openable to uncover the outlets, the improvement comprising separate steps of closing the cover means and latching the latchable means, including first closing the cover means to cover the outlets, then latching the latchable means by moving the same to retain the cover means in the closed position, and securing the latchable means in the latched position by interposing latch-securing means that must be overcome before the latching means can be moved back to its cover-open position; and separate steps of unlatching the latching means and opening the cover means, including overcoming the latch-securing means, unlatching the latching means, and then opening the covering means.

18. Electrical receptacle safety covering procedure according to claim 17, wherein the latching procedure includes the step of moving a latch member in one direction to a position in which the latch member is free of latching or unlatching-inhibiting spring-bais, which precludes movement of it to the opposite or unlatched position, the unlatching procedure includes the steps of overcoming the spring-bias by manually depressing a latch-securing spring, and moving the latch member from its latched position to a position overlying the depressed latch-securing spring, thereby holding it depressed.

19. Electrical receptacle safety covering procedure according to claim 17, including—only when the cover means is in the open position—the steps of first lifting the cover means to disengage it from the plate means, and then removing the cover means from the vicinity.

20. Electrical receptacle safety covering procedure according to claim 17, including—only when the cover means is in the open position—the steps of inserting an electrical plug attached to an electrical cord into one of the outlets, and inserting the electrical cord into a recess in the cover or plate means, whereby the cover means may be closed with the plug in place in the outlet.

21. Safety covering for outlets of an electrical receptacle, capable of being closed without being latched, and comprising plate means to admit and fit over the receptacle outlets, cover means to fit over the plate means, pivoted thereto, to swing open to expose the receptacle outlets, and to swing closed to closed off the receptacle outlets;

latching slide means slidable along an edge of such means to a latched position, in the closed covering position, in which such slidable means engages adajcent edges of both the plate means and the cover means, or to an unlatched position, in either the open or closed covering position, in which such latching slide means engages edges of only one of such means; and securing means adjacent the latching slide means and normally effective to preclude the latching means from sliding between the latched position and the unlatched position.

22. Electrical receptacle safety covering according to claim 21, wherein the securing means comprises a spring member carried by either the cover means or the plate means independently of the latching slide means and normally biased to protrude into the path of the latching slide means when sliding from the latched position to the unlatched position.

23. Electrical receptacle safety covering according to claim 22, wherein such spring member has a normally protruding portion manually depressible from its customary position, in which it is effective to preclude the latching slide means from sliding from the latched position to the unlatched position, to a depressed position wherein the slide means is capable of overlying the spring member and of then being slid manually from the latched position to the unlatched position.

24. Electrical receptacle safety covering according to claim 23, wherein such normally protrudible portion of the spring member must be manually depressed before the latching slide means is capable of overlying it and of then being manually slidable from the latched position to the unlatched position.

25. Electrical receptacle safety covering according to claim 24, wherein such normally protrudible portion of the protruding spring member need not be manually depressed before the latching slide means is manually slidable from the unlatched position to the latched position but is automatically depressed by being overlain by the latching slide means whenever the latching slide means is slid manually from the unlatched position to the latched position.

26. Safety covering for outlets of an electrical receptacle, having a closed position to cover such outlets and having also an open position wherein such outlets are available to receive plugs, capable of being closed without being latched, also capable of being latched without any latching spring bias, and comprising plate means to admit and fit over the receptacle outlets, cover means to fit over the plate means, pivoted thereto, to swing open to expose the receptacle outelts, and to swing closed to close off the receptacle outlets;

the plate means and the cover means respectively having side edge portions abutting one another in the closed position only and grooved to carry means slidable therealong;

spring-free latching slide means slidable along such grooved edge portions of such means between a latched position, in the closed covering position, in which such slidable means engages grooved adjacent edge portions of both the plate means and the cover means, and an unlatched position, in either the open or closed covering position, in which such latching slide means engages grooved edge portions of only one of such means; and securing means adjacent the latching slide means, normally biased to preclude the latching means from sliding between the latched position and the unlatched position, and comprising a spring member, carried by either the cover means or the plate means independently of the latching slide means, and manually depressible from its customary position, in which it is protruding and thereby effective to preclude the latching slide means from sliding from the latched position to the unlatched position, to a depressed position wherein the slide means is capable of being slid manually from the latched position to the unlatched position and back to the latched position.

27. Electrical receptacle safety covering according to claim 26, wherein the grooved edge portions of the respective plate and cover means are offset in part to align their respective grooves in the closed position.

28. Electrical receptacle safety covering according to claim 26, wherein the spring-free latching slide means is U-shaped with its ends adapted to ride in the grooed edge portions of the plate and cover means.

29. Electrical receptacle safety covering according to claim 26, including, respectively, a pair of such spring-free latching slide means, at opposite ends of aligned grooves in the plate and cover means in the closed position, and a pair of intermediately located spring-biased latch-securing means with their depressible normally protruding parts adjacent the respective latching slide means in their latched position with the cover closed.

30. Safety covering for an electrical receptacle having one or more electrical outlets adapted to receive an electrical plug, and having an open position and a closed position, and comprising rigid plate means, open at its back to admit the outlet or outlets of such an electrical receptacle, and including forwardly extending edges along its perimeter, pivot means along one side edge, and flange means extending sidewise and forward from and along part of an opposite side edge, with a groove in the back face thereof parallel to such edge, an adjoining edge portion of such side edge being recessed with regard to the flange means;

rigid cover means, closed at its front for safety, including rearwardly extending edges along its perimeter adapted to abut the forwardly extending edges along the perimeter of the palte means in the closed position, pivot means along one side edge adapted to cooperate with the pivot means along one side edge of the plate means to enable the cover means to swing to the open and closed positions, the opposite side edge having a rearwardly extending raised edge portion adapted to abut the recessed edge protion fo the flanged edge of the plate means, a groove in the back face of the raised edge portion and parallel to such edge, and a groove in the front face of the edge having the raised edge portion and parallel to such edge; and carrying depressible spring means protruding sidewise from such raised edge protion and adapted to secure the cover means in the closed position;

slide means along such opposite edge and adapted to fit slidably in the grooves in the front and back faces of the cover means, in the depressed position of such spring means, in the open cover position, and to fit slidably in the groove in the back face of the plate means and the corresponding part of the groove in the front face of the cover means, in the non-depressed position of such spring means, in the closed cover position, and thereby to be secured in the closed cover, latched slide position by the spring means in the absence of depression of the spring to enable unlatching of the slide means.

* * * * *